United States Patent [19]

Shindo et al.

[11] Patent Number: 6,022,751
[45] Date of Patent: Feb. 8, 2000

[54] PRODUCTION OF ELECTRONIC DEVICE

[75] Inventors: Hitoshi Shindo, Hadano; Akira Okita, Yamato, both of Japan

[73] Assignee: Canon Kabushiki Kaisha, Tokyo, Japan

[21] Appl. No.: 08/955,816

[22] Filed: Oct. 22, 1997

[30] Foreign Application Priority Data

Oct. 24, 1996 [JP] Japan .................................. 8-282341

[51] Int. Cl.⁷ .......................... H01L 21/302; C30B 33/00; H01B 13/00
[52] U.S. Cl. .............................. 438/21; 438/30; 438/751; 438/756; 438/757; 216/23; 216/27; 216/51; 216/95
[58] Field of Search .................................. 216/2, 23, 27, 216/47, 51, 95; 438/21, 30, 608, 751, 756, 757

[56] References Cited

U.S. PATENT DOCUMENTS 3,479,237  11/1969  Bergh et al. .............................. 156/11
3,675,314  7/1972  Levi ........................................... 29/578
3,899,363  8/1975  Dennard et al. ........................... 148/1.5
4,092,211  5/1978  Morris ........................................ 156/644
5,181,132  1/1993  Shindo et al. .............................. 359/58
5,658,471  8/1997  Murthy et al. .......................... 156/626.1

FOREIGN PATENT DOCUMENTS 0 701 276   3/1996  European Pat. Off. .
01 022051   1/1989  Japan .
1 310 188   3/1973  United Kingdom .

Primary Examiner—Benjamin Utech
Assistant Examiner—George Goudreau
Attorney, Agent, or Firm—Fitzpatrick, Cella, Harper & Scinto

[57] ABSTRACT

A process for producing an electronic device having a silicon nitride film on a substrate is provided which comprises steps of forming a silicon nitride film and a silicon oxide film on a first face and a second face reverse to the first face of the substrate respectively, removing the silicon oxide film on the first face by wet etching, removing the silicon nitride film on the first face by wet etching, and removing the silicon oxide film on the second face by wet etching.

13 Claims, 8 Drawing Sheets

PRODUCTION OF ELECTRONIC DEVICE

BACKGROUND OF THE INVENTION

1. Field of the Invention

The present invention relates to a process for producing an electronic device, specifically to a process for producing a substrate for liquid crystal display device or a recording head, comprising removal of a part of the substrate.

2. Related Background Art

Conventionally, in formation of a silicon nitride film on an element side only of a substrate, as shown in FIG. 10, silicon nitride films 12,13 are once formed by CVD (Chemical Vapor Deposition) on both faces of substrate 11 inevitably owing to the CVD apparatus constitution, and thereafter silicon nitride film 13 from the reverse face is removed.

In one method for the above film formation on one face side, photoresist 16 or the like is applied on silicon nitride film 12, and silicon nitride film 13 on the reverse face is removed by etching. A hot phosphoric acid solution is a general etchant for silicon nitride. However, photoresist 16 is not sufficiently resistant against the hot phosphoric acid, so that this wet etching is not applicable for the silicon nitride film removal.

Therefore, the removal of the silicon nitride film on the reverse face is usually conducted by dry etching for formation of a silicon nitride film only on the element side face.

The dry etching method includes CDE (chemical dry etching), RIE (reactive ion etching), and so forth. In the CDE method, one of the faces should be protected by protection film such as a photoresist to prevent etching of both of the front face and the reverse face by the diffused gas. In the RIE method, the substrate should be turned over before the etching of the nitride film on the reverse face, since only the face exposed to plasma is etched in usual RIE system. For the turning-over, the front face (element side) of the substrate is brought into contact with an arm, a belt or the like or the electrode of the apparatus. This can cause scratches on the element face, or dust formation to give defects of the element. To prevent the defects, the surface should be protected by a protection film composed of a resin or the like in the RIE method also.

For removing the silicon nitride film on the reverse face of the substrate, the front face (element side) thereof should be protected by forming an organic film like a resist for delivery and etching in any of dry etching methods as described above.

However, disadvantageously the organic resin film will form particles by contact with mechanical parts such as an arm and a belt of the delivery system, or the organic resin will adhere onto the electrode of the apparatus by clamping of the substrate by the electrode to impair the contact of the substrate with the electrode, causing rise of the substrate temperature during etching and impairing the etching selectivity.

SUMMARY OF THE INVENTION

An object of the present invention is to provide a process for producing an electronic device including removal of a part of a component of the substrate, such as a nitride film on the reverse face of the substrate, the process comprising removal of the part of the substrate component such as the nitride film on the reverse face of the substrate by wet etching only without employing dry etching and without causing scratches of the substrate by delivery system or by substrate chuck or without causing element defects by a foreign matters in the dry etching system.

The process for producing an electronic device of the present invention having a silicon nitride film on a substrate comprises steps of forming a silicon nitride film and a silicon oxide film on a first face and a second face reverse to the first face of the substrate respectively, removing the silicon oxide film on the first face by wet etching, and removing the silicon nitride film on the first face by wet etching, and removing the silicon oxide film on the second face by wet etching.

According to the process of the present invention, a silicon nitride film on a region of the substrate can be peeled off by wet etching with the nitride film on the rest regions unremoved. Thereby, an electronic device can be produced without the disadvantage of scratch formation on the substrate caused by a delivery system or a substrate chuck, or without the disadvantage of element defect formation caused by a foreign matters in the dry etching apparatus.

In the process for producing an electronic device of the present invention, a silicon nitride film is grown on both faces of a substrate, a silicon dioxide film is formed on the respective silicon nitride films, the silicon oxide of the reverse face is removed, for example, by aqueous solution containing hydrogen fluoride, and the silicon nitride film on the reverse face is removed, for example, by an aqueous solution containing phosphoric acid, thereby the silicon nitride film on the reverse face being peeled off by wet etching without employing a dry etching system. Thereby, a base member of a liquid crystal display apparatus or a recording head can be produced without the disadvantage of scratch formation on the substrate caused by a delivery system or a substrate chuck, or without the disadvantage of element defect formation caused by a foreign matters in the dry etching apparatus.

DESCRIPTION OF THE PREFERRED EMBODIMENTS

Embodiment 1

FIGS. 1A to 1F are schematic sectional views for explaining the production steps of the present invention.

Figure 1A:
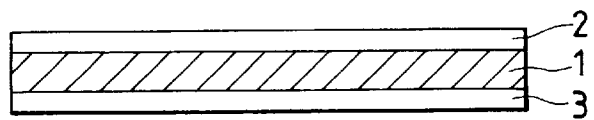
FIGS. 1A, 1B, 1C, 1D, 1E and 1F are schematic sectional views for explaining the process flow of Example 1 of the present invention.

Firstly, silicon nitride films 2,3 are grown on substrate 1 by a CVD method such as a low pressure chemical growth method (FIG. 1A).

Figure 1B:
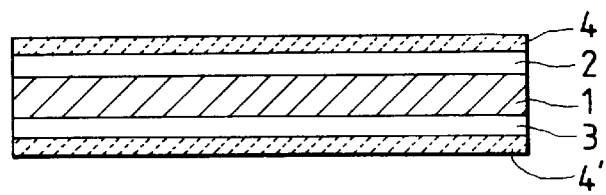

Thin silicon films 4,4' are grown by a CVD method such as a low pressure chemical growth method (FIG. 1B).

Figure 1C:
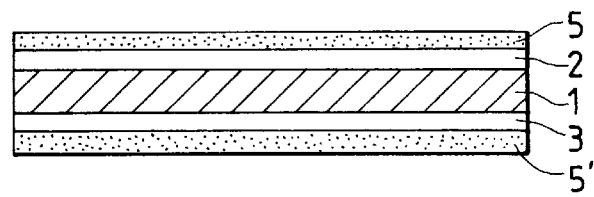

Thin silicon films 4,4' are oxidized into thin silicon dioxide film 5,5' (FIG. 1C).

Figure 1D:
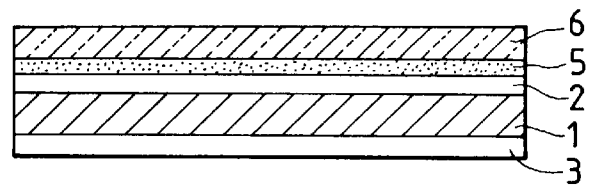

Then, photoresist 6 is formed on the front face. Silicon oxide film 5' on the reverse face is removed by an aqueous solution containing hydrogen fluoride as a first wet etching solution which is unreactive to the silicon nitride (FIG. 1D).

Figure 1E:
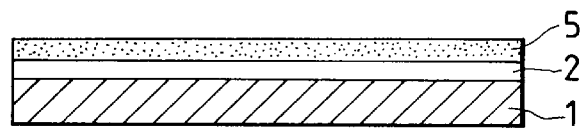

Photoresist 6 is removed, and silicon nitride film 3 on the reverse face is removed by an aqueous solution containing phosphoric acid as a second wet etching solution (FIG. 1E).

Figure 1F:
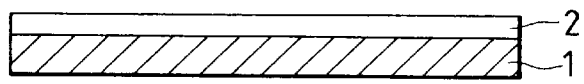

Finally, silicon oxide film 5 on the front face is removed by the first wet etching solution (FIG. 1F).

In such a manner, the nitride film on the reverse face can be peeled off by wet etching without employing a dry etching system.

The first etching solution contains hydrogen fluoride, including an aqueous hydrogen fluoride solution, an aqueous solution containing hydrogen fluoride and ammonium fluoride, and an aqueous solution containing hydrogen fluoride and hydrogen peroxide.

The second etching solution contains phosphoric acid, including a heated aqueous phosphoric acid solution, and an aqueous solution containing phosphoric acid and hydrogen peroxide.

The silicon nitride film in the present invention includes not only an $Si_3N_4$ film but also films having bonds between silicon atoms and nitrogen atoms (e.g., SiN film). The silicon oxide film in the present invention includes not only an $SiO_2$ film but also films having bonds between silicon atoms and oxygen atoms (e.g., SiO film).

The above process is applicable to production, for example, of a liquid crystal display apparatus, and an ink-jet recording head. In the production of the liquid crystal display apparatus, the process is applicable to formation of a silicon nitride film on a part of a base member. In the production of the ink-jet recording head also, the process is applicable to formation of a silicon nitride film on a part of a base member.

EXAMPLE 1

In this Example, according to the present invention, a liquid crystal display apparatus is produced which comprises a semiconductor substrate having picture element electrodes arranged in correspondence with intersecting points of signal lines and scanning lines, and a driving circuit for driving the picture element electrodes at periphery of the element electrode portion, a semiconductor substrate with the portion under picture display region of the substrate cut off for light-transmission; and liquid crystal held between the semiconductor substrate and a counter substrate opposing thereto.

Figure 3:
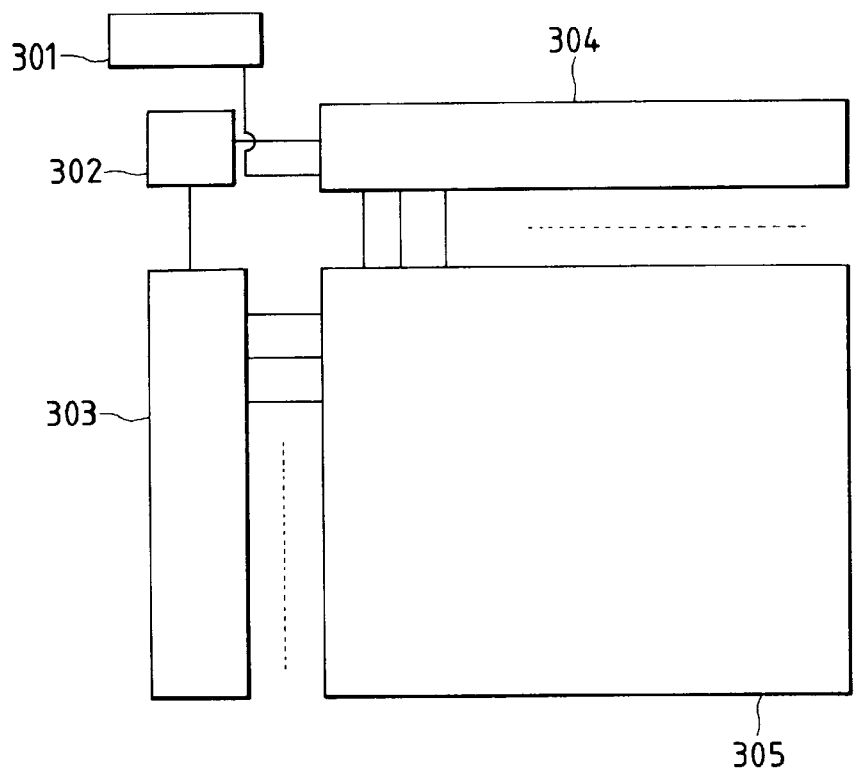
FIG. 3 is a schematic drawing showing the liquid crystal panel of Example 1.

A panel constitution of the liquid crystal display apparatus produced in this Example is explained firstly. FIG. 3 is a schematic drawing showing the liquid crystal panel of this Example.

In FIG. 3, vertical shift register 303 and horizontal shift resister 304 are connected to panel display circuit 305 having switching elements of poly-Si TFT arranged in matrix. TV picture signals transferred from video signal circuit 301 are written through vertical shift register 303 and horizontal shift resister 304 into picture elements in display circuit 305, and synchronizing circuit 302 synchronizes two shift registers 304,305.

Figure 4:
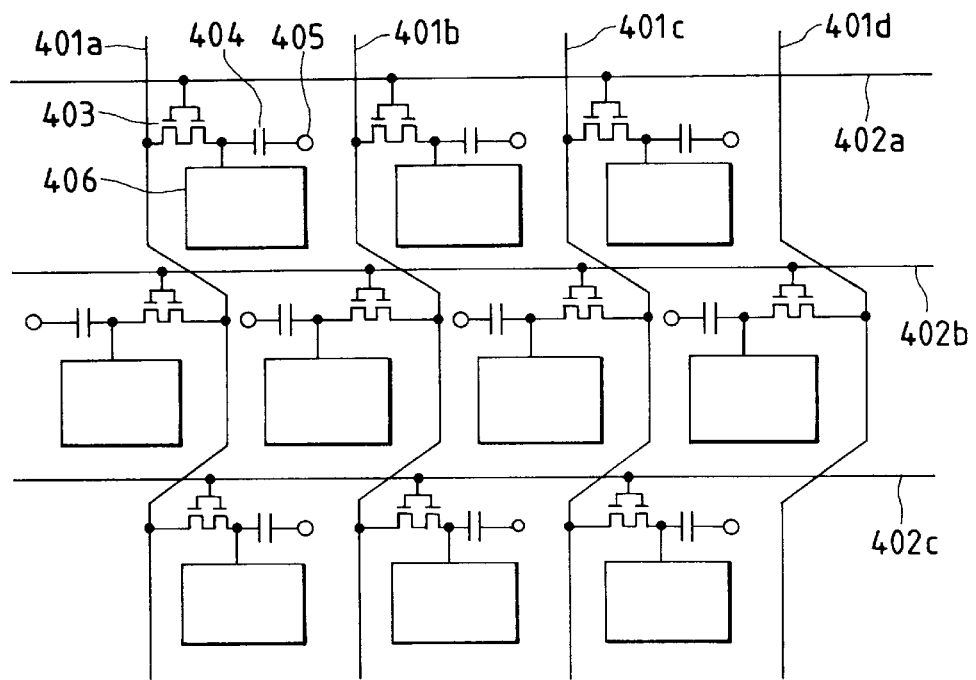
FIG. 4 is an equivalent circuit diagram of the liquid crystal panel of Example 1.

FIG. 4 is an equivalent circuit diagram of this liquid crystal panel. In FIG. 4, picture element electrodes 406 are arranged in correspondence with the intersecting points of signal lines 401a–401d and scanning lines 402a–402c. Drains of TFTs (thin film transistors) 403 are connected to the picture element electrodes. Signal lines 401a–401d are connected respectively to the sources of TFTs 403, and scanning lines 402a–402c are connected respectively to the gates of TFTs 403. Video signals from signal lines 401a–401d are written into picture element electrodes (pixel electrodes) 406. The drains of TFT 403 are also connected to retention capacities 404 to retain the written electric charges for a sufficiently long time. The other ends 405 of the electrodes of retention capacities 404 are connected to a potential common to all the picture elements or potentials common respectively to the picture elements in each one row direction.

Although an active matrix type liquid crystal display apparatus is described above, the present invention is not limited thereto. The present invention is also applicable to other devices such as the one having MIM elements or PN junction elements provided in correspondence with intersecting points of signal lines and scanning lines.

Figure 5:
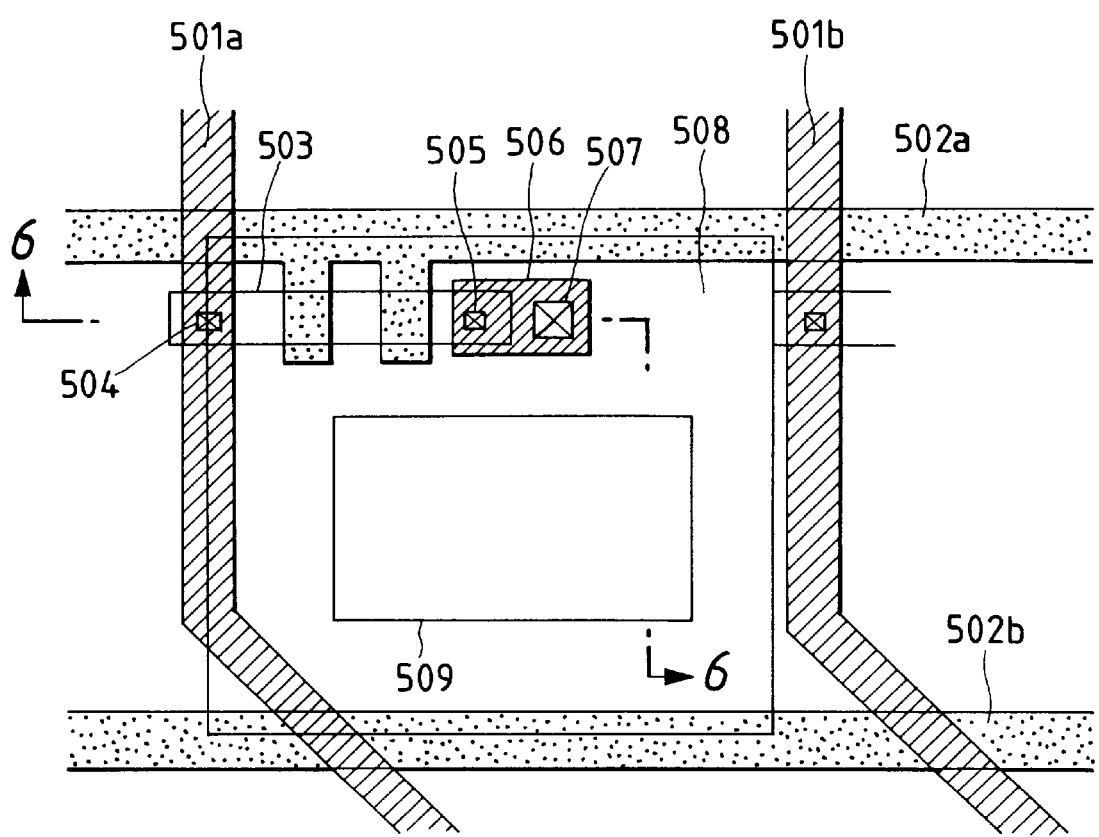
FIG. 5 is a schematic plan view showing a structure of picture element portion of the liquid crystal panel of Example 1.

FIG. 5 is a schematic plan view showing a structure of picture element portion of the liquid crystal panel of Example 1. One picture element is surrounded by two adjacent signal lines 501a, 501b, and two adjacent scanning lines 502a, 502b. The source of TFT 503 formed from polycrystalline silicon film is connected through contact hole 504 to signal line 501a. Signal charges are written through two gates into the drain. The TFT is connected through contact 505 to metal electrode 506. Metal electrode 506 is connected via through-hole 507 to light-transmissive picture element electrode 508. The numeral 509 indicates an aperture of a light-intercepting film which intercept undesired light directed to the TFT.

Figure 6:
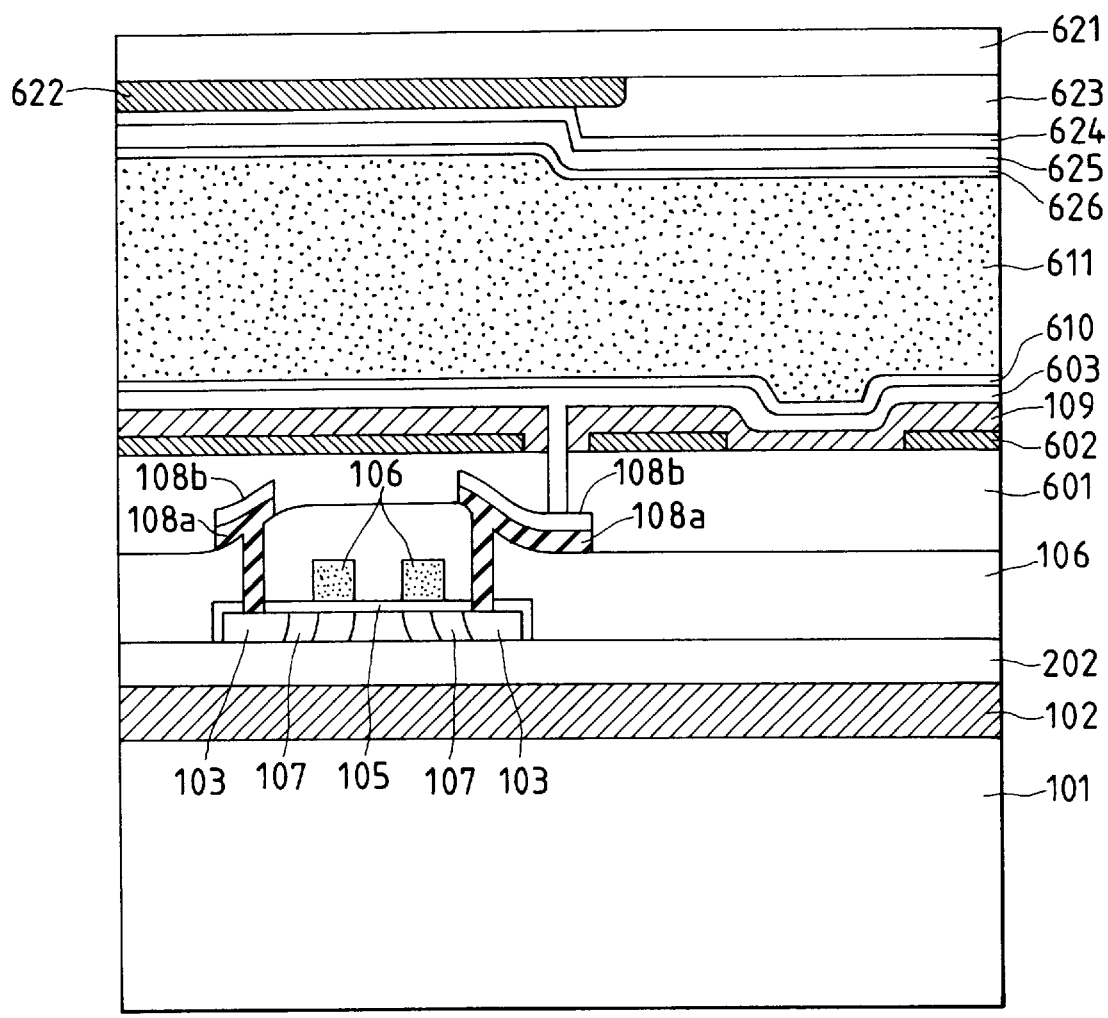
FIG. 6 is a schematic sectional view of a picture element portion of the liquid crystal panel of Example 1.

FIG. 6 is a sectional view of the picture element portion taken along line 6—6 in FIG. 5. In FIG. 6, oxide film 102 of 400–1200 nm thick, and silicon nitride film 202 are formed on a silicon substrate. On the silicon nitride film, silicon oxide film is formed in a thickness of 10 to 100 nm to separate the TFT and the silicon nitride film. The TFT has low-concentration n-type layer 107 for electric field relaxation, and high-concentration source/drain 103. These are counterposed to two polysilicon electrodes 106 with interposition of gate oxide film 105. Source electrode, drain electrode are composed of a lamination film constituted of Al film 108a and Ti film 108b, facilitating the ohmic contact to image element electrode 603. Light-intercepting film 602 is constituted, for example, of a TiN film, and is isolated from the source/drain electrodes by film 601 of PSG or the like, and from TFT by film 106 of BPSG or the like. The numeral 109 denotes an insulating film such as a silicon nitride film which separates the picture element electrode 603 from the light-intercepting film 602. The numeral 610 denotes a liquid crystal aligning film, formed from a polyimide.

An active matrix substrate is formed from the members of from substrate 101 to aligning film 610 as shown in FIG. 6. With interposition of TN liquid crystal 611, aligning film 626, protection film 625, and light-transmissive electrode 624 are provided on the side of counter electrode 621. Color filter 623 containing, for example, a pigment is provided in correspondence with an aperture of light-intercepting film 602, and black matrix 622 made from Cr or the like is provided in correspondence with the light-intercepting portion.

Figure 2:
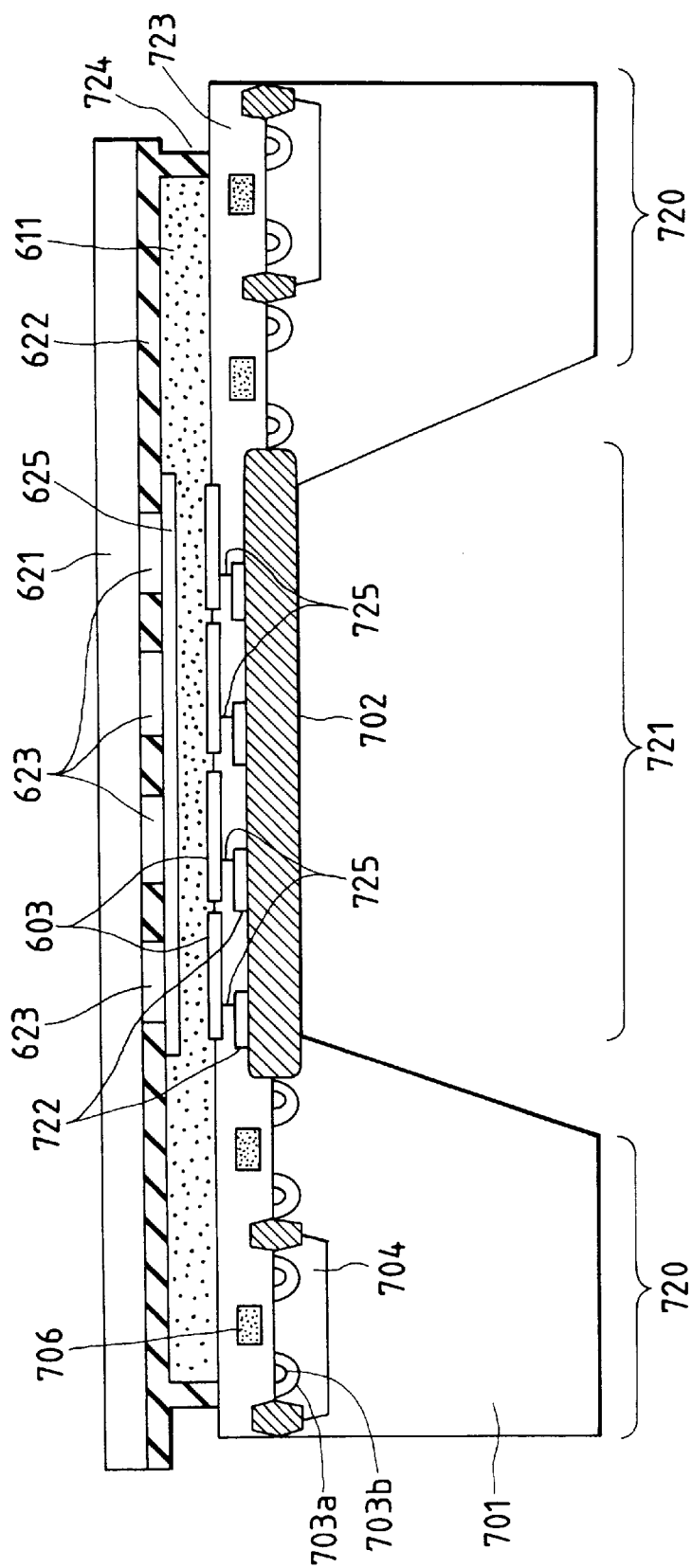
FIG. 2 is a schematic sectional view of the display apparatus of Example 1.

FIG. 2 shows a schematic sectional view of the display panel including the picture element display region and the peripheral driving section. In FIG. 2, the numeral 701 denotes a silicon substrate; 702, a thick oxide film (field oxide film) for isolation of the elements; 703a, a low-concentration source/drain of NMOS transistor; 703b, a high-concentration source/drain of NMOS transistor; 704, a p-type well of the N-type transistor; 706, a polysilicon gate electrode; 720 a supporting portion of the silicon substrate; and 721, a light-transmissive region formed by removal of substrate silicon and serves as the panel display portion (picture element display region).

The numeral 722 denotes TFTs, 723 denotes an insulating film and 725 denotes wiring portions which connect the TFTs 722 and the picture element electrodes 603.

In FIG. 2, the TFT substrate (semiconductor substrate) is placed parallel to opposing substrate 621, and liquid crystal material 611 is sealed therebetween. Spacer 724 is provided to maintain the thickness of liquid crystal 611 designed in consideration of the optical characteristics of the liquid crystal. In opposition to picture element electrodes 603, light-transmissive electrode 625 common to all or plural picture elements is provided to apply voltage to the liquid crystal. In FIG. 2 showing a full-color display panel, color filters 623 containing a dye or a pigment are provided on counter electrode 621, and the area except the picture element portions and the area of the peripheral driving circuit are intercepted from light by black matrix 622 of Cr or the like.

As liquid crystal material 611, liquid crystal of a TN type (twisted nematic liquid crystal) is effective usually. Otherwise, STN (super-twisted nematic) type liquid crystal, and FLC (ferroelectric liquid crystal), PDLC (polymer-diffused liquid crystal) are useful therefor. For use of TN, STN, or FLC, a cross nicol polarization plate should be provided in the front and back of the display apparatus. The back light necessary for the displaying may be projected either from the top side or from the bottom side in FIG. 2.

The process for producing the TFT substrate in FIG. 2 is explained by reference to FIG. 7.

Firstly, monocrystalline silicon substrate 801 is thermally oxidized in a $H_2/O_2$ atmosphere at 1000° C. to form silicon oxide film 802 of 700 nm thick on monocrystalline silicon substrate 801.

Portions of the silicon oxide film 802 where NMOS transistors are formed are removed by a conventional photolithography technique and a conventional etching technique.

Figure 7A:
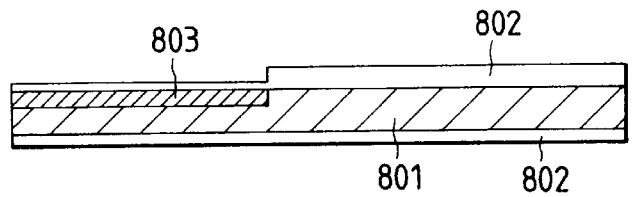
FIGS. 7A, 7B, 7C, 7D, 7E, 7F and 7G are schematic sectional views illustrating the production steps in Example 1.

Then p-well region 803 is formed by ion implantation and heat treatment, and the silicon oxide film is removed by an aqueous buffered hydrogen fluoride solution (FIG. 7A).

Figure 7B:
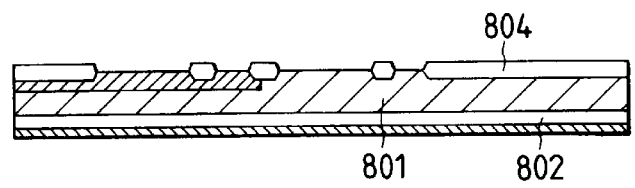

On the monocrystalline element isolation region and the picture image display region for poly-Si TFT formation, field oxidation film 804 is formed by a LOCOS process (FIG. 7B).

Figure 7C:
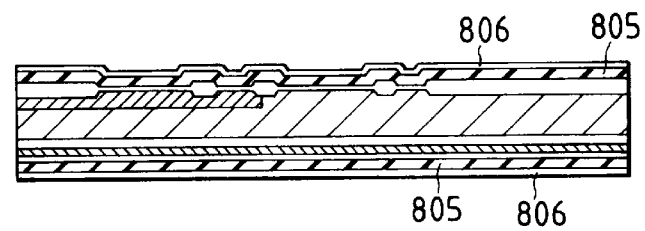

Thereon, silicon nitride film 805 is deposited in a thickness of 400 nm by reaction of $SiH_4$ (silane) and $NH_3$ (ammonia) by a low-pressure CVD system. Then polycrystalline silicon 806 is deposited thereon in a thickness of 700 Å by thermally decomposing a nitrogen-diluted silane gas at 600–700° C. by low-pressure CVD (FIG. 7C).

The polycrystalline silicon is completely converted into silicon dioxide 807 by thermal oxidation in an oxygen-hydrogen atmosphere at 1000° C.

Figure 7D:
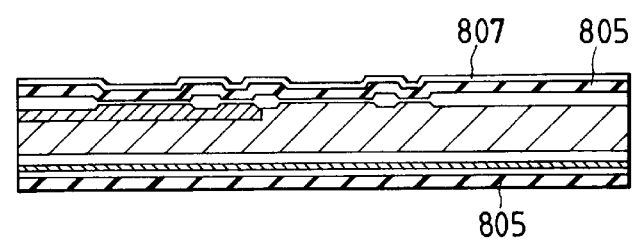

A photoresist is applied in a thickness of 1.0 μm onto the upper face, and cured by heating. Then the silicon oxide film on the reverse face is removed by immersion into a buffered hydrofluoric acid solution as the first etching agent, which is the characteristic of the present invention (FIG. 7D).

Figure 7E:
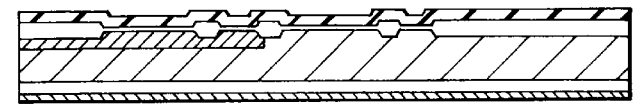

The photoresist on the front face is removed. Silicon nitride film 805 on the reverse face is removed by immersing the substrate into a heated phosphoric acid solution as the second wet etching solution. Then, silicon dioxide film 807 on the silicon nitride film on the front face is removed by a buffered hydrofluoric acid solution (FIG. 7E).

Figure 7F:
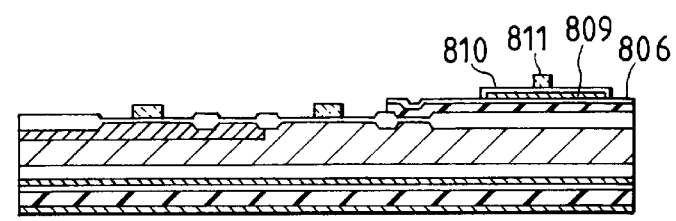

Thereon, silicon oxide film 806 is deposited in a thickness of 50 nm by reaction of $SiH_4$ (silane) and $N_2O$ (nitrous oxide) at 800° C. by low-pressure CVD. Thereon, polycrystalline silicon film 809 is deposited in a thickness of 50–200 nm by thermal decomposition of nitrogen-diluted silane gas at 600–700° C. by low-pressure CVD. The thickness of the polycrystalline silicon is preferably smaller since the smaller thickness of the polycrystalline silicon leads to smaller leakage current between the source and the drain. In this Example, the thickness of the gate oxide film 810 is designed to be 80 nm, and the thickness of the polycrystalline silicon deposition film is designed to be 80 nm in consideration of variation of the process. The gate oxide film can be formed by utilizing an ONO film (oxidized-nitrided oxide film) formed by oxidation and succeeding nitridation-oxidation, or by deposition of a silicon oxide film by CVD. After the formation of the gate oxide film, polycrystalline silicon 110 for the gate electrode is deposited in a thickness of 100–500 nm. The polycrystalline silicon is doped in a high concentration, and is patterned to form gate electrode 811 (FIG. 7F). In this Example, doping with phosphorus is conducted in a gas phase. Otherwise, ion implantation or ion doping of arsenic or phosphorus may be employed. A conventional technique may be suitably employed.

Then PSG (phosphosilicate glass) is deposited as interlayer insulating film 812 in a thickness of 600 nm by use of $SiH_4$ (silane), $O_2$ (oxygen), and $PH_3$ (phosphine) as source gases by atmospheric pressure CVD. Instead, the interlayer insulation film can be formed from NSG (non-doped silicate glass), BPSG (borophosphosilicate glass), or a like film.

Contact holes are opened, and aluminum 813 doped with 0.5–2.0% silicon is deposited in a thickness of 600 nm by magnetron sputtering. The electrode material may be a material employed in usual semiconductor process or TFT process, such as Al alloys, W, Ta, Ti, Cu, Cr, and Mo, and silicide thereof. Al wiring 814 is formed by patterning of the electrode material.

Silicon oxide film 814 is formed as a second interlayer insulation film in a thickness of 1000 nm by plasma CVD.

The polysilicon film or silicon nitride film formed by LP-CVD or a silicon oxide film formed by thermal oxidation is removed from the portion of the reverse face where the monocrystalline substrate is to be removed later for light-transmission.

Through-holes are formed in the second interlayer insulation film, and light-intercepting layer 817 is formed by deposition of TiN by magnetron-sputtering and patterning.

Figure 7G:
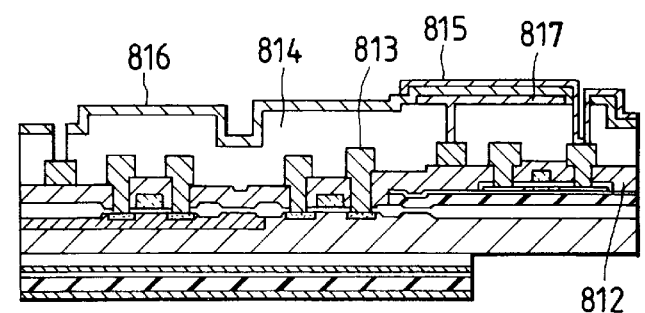

Then, a silicon nitride film is deposited as the element protection film 816 in a thickness of 270 nm by plasma CVD. Light-transmissive electrode 815 is formed by depositing ITO (indium tin oxide) by magnetron sputtering (FIG. 7G).

The TFT substrate prepared by the above process and a counter electrode prepared separately are bonded together. Liquid crystal is injected therebetween and the injection opening is sealed. Then, the face of the TFT substrate side of the above liquid crystal cell is immersed into a TMAH solution (tetramethylammonium hydroxide solution) to etch the monocrystalline silicon substrate by utilizing the patterned silicon oxide film and silicon nitride film on the reverse face of the TFT substrate as the mask. Thereby the etched portion is made light-transmissive. Thus a light-transmitting liquid crystal display apparatus is prepared.

According to the above process, a liquid crystal display apparatus was produced which has 320,000 picture elements. The resulting liquid crystal display apparatus had no defect such as scratch formed at peeling of silicon nitride from the reverse face, breakage of wiring by a foreign matter, defect of the picture element or the line by short circuit, and defective aligning of the liquid crystal caused by defects of the picture element of TFT substrate.

EXAMPLE 2

A liquid crystal display apparatus having the same structure as the one in Example 1 is provided in the same manner except that the thin silicon film at the peeling of the silicon nitride film is changed from polycrystalline silicon to amorphous silicon to improve surface smoothness of the oxide film, the oxide film is not removed, and TFT is formed thereon.

p-Well regions and element isolation regions are formed on a silicon substrate in the same manner as in Example 1. Thereon, a silicon nitride film is deposited in a thickness of 300 nm by reaction of $SiH_4$ (silane) and $NH_3$ (ammonia) by low pressure CVD.

Thereon, amorphous silicon is deposited in a thickness of 1000 Å by thermal decomposition of a nitrogen-diluted silane gas at 450° C. by low pressure CVD. The above polycrystalline silicon is converted completely to silicon dioxide at 1000° C. by thermal oxidation in an oxygen-hydrogen atmosphere.

On the surface thereof, a photoresist is applied in a thickness of 1.0 $\mu$m, and cured by heating. The silicon oxide film on the reverse face is removed by immersion into a buffered hydrofluoric acid as the first wet etching solution which is the characteristic process of the present invention.

The photoresist on the front face is removed. Then the silicon nitride film on the reverse face is removed by immersion of the substrate into a heated phosphoric acid solution as the second wet-etching solution.

On the aforementioned silicon dioxide formed by oxidation of the amorphous silicon, polycrystalline silicon is deposited to form a TFT. Thereafter TFT substrate is prepared in the same manner as in Example 1.

The TFT substrate prepared by the above process and a counter electrode prepared separately are bonded together. Liquid crystal is injected therebetween and the injection opening is sealed. Then, the face of the TFT substrate side of the above liquid crystal cell is immersed into a TMAH solution (tetramethylammonium hydroxide solution) to etch the monocrystalline silicon substrate by utilizing the patterned silicon oxide film and silicon nitride film on the reverse face of the TFT substrate as the mask. Thereby the etched portion is made light-transmissive. Thus a light-transmitting liquid crystal display apparatus is prepared.

According to the above process, a liquid crystal display apparatus was produced which has 320,000 picture elements. The liquid crystal display apparatus had no defect such as scratch formed at peeling of silicon nitride from the reverse face, breakage of wiring by a foreign matter, defect of the picture element or the line by short circuit, and defective aligning of the liquid crystal by defects of the picture element of TFT substrate.

The electric properties of the TFT of the above TFT substrate (e.g., threshold voltage, field effect mobility, S coefficient, etc.) were not different from the properties of the one of Example 1 which was produced by deposition on silicon dioxide deposited by high temperature CVD.

EXAMPLE 3

A base member for a recording head is prepared by removing a part of the base member according to the present invention.

Figure 8:
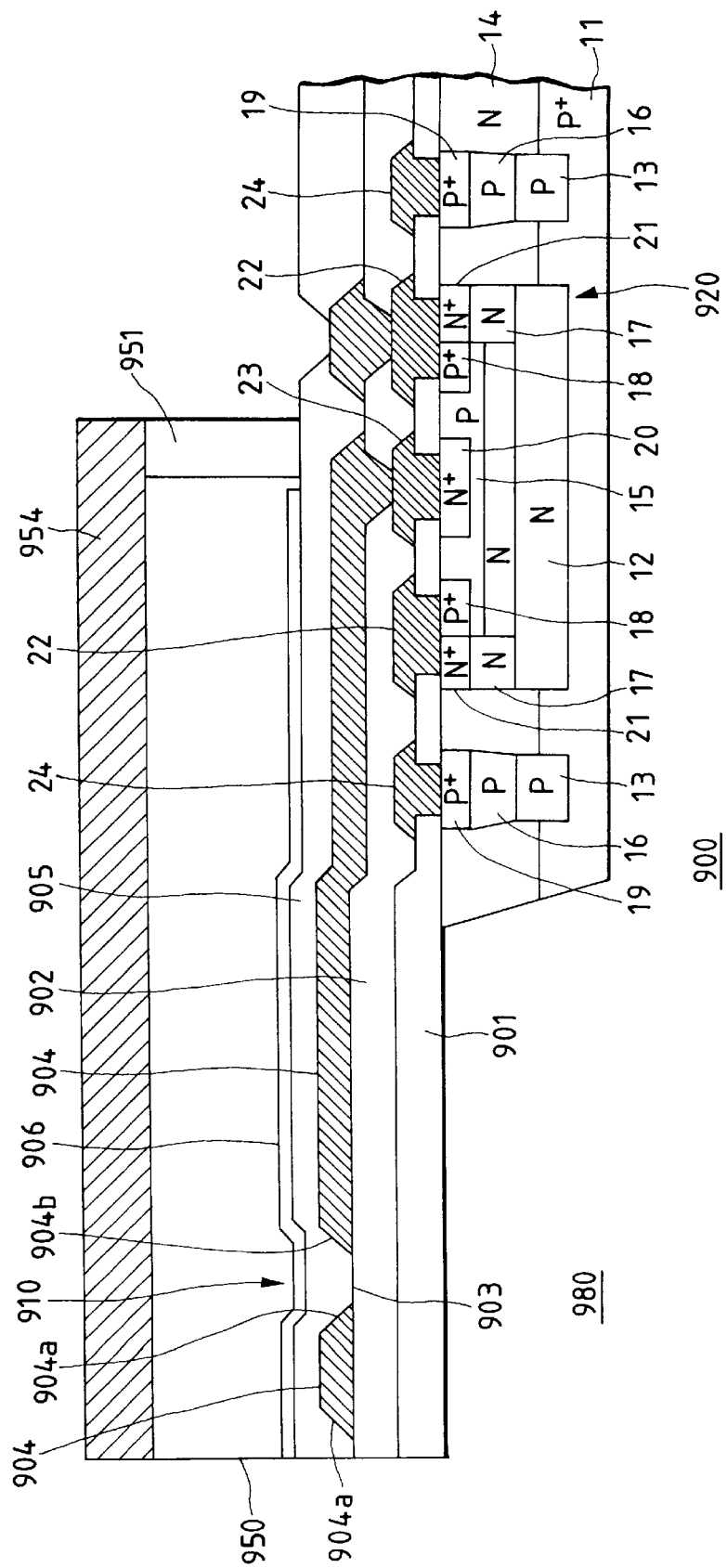
FIG. 8 is a schematic sectional view of the recording head base member produced in Example 3.

FIG. 8 is a schematic sectional view of the recording head base member prepared according to the present invention.

Base member 900 for a recording head is prepared by forming heat-generating portion 910 as an electro-thermal transducer element and bipolar type NPN transistor 920 as a drive-functioning element on a P-type silicon substrate 11.

In FIG. 8, the numeral 11 is a P-type silicon substrate; 12, a N-type collector region for forming a functional elements; 13, a P-type isolation-burying region; 14, an N-type epitaxial region; 15, a P-type base region for forming functional elements; 16, an isolation-burying region for element isolation; 17, an N-type collector-burying region for constituting functional elements; 18, a high-concentration P-type base region for constituting element isolation; 19, a high-concentration P-type isolation region for element isolation; 20, an N-type emitter region for constituting an element; 21, a high-concentration N-type collector region for constituting an element; 22, a collector-base common electrode; 23, an emitter electrode; and 24, an isolation electrode.

Thus, NPN transistor 920 is formed, and collector regions 12,14,17,21 are formed so as to surround completely emitter region 20 and base regions 15,18. Each cell is surrounded and electrically isolated by P-type isolation burying regions, P-type isolation regions 16, and high-concentration P-type isolation regions as element isolation regions.

NPN transistor 920 is constituted of two high-concentration N-type collectors 21 formed on P-type silicon substrate 11 with interposition of N-type collector-burying region 12 and N-type collector-burying region 12; two high-concentration P-type base regions 18 formed inside the high-concentration N-type collector regions 21 with interposition of N-type collector-burying region 12 and P-type base region 15; and high-concentration N-type emitter region 20 formed between high concentration bases 18 with interposition of N-type collector-burying region 12 and P-type base region 15. High-concentration N-type collector region 21 and high-concentration P-type base region 18 are connected by collector-base common electrode 22 to serve as a diode.

In adjacency to NPN transistor 920, P-type isolation-burying regions 13, P-type isolation regions 16, and high-concentration P-type isolation regions 19 are successively formed.

Heat-generating resistance layer 903 is formed on P-type silicon substrate 11 with interposition of N-type epitaxial region 14, heat accumulation layer 901, and interlayer film 902 formed integrally with heat accumulation layer 901. Wiring electrode 904 formed on heat-generating resistance layer 903 is cut to form two edge portions 904a as the connecting terminal faces. Thereby heat-generation portion 910 is formed.

The aforementioned base member 900 for a recording head is covered entirely with heat-accumulation layer 901 composed of a silicon nitride film, and functional elements and electrodes 22,23,24 are formed from Al or a like material.

Base member 900 of this Example has P-type silicon substrate 11 having collector-base common electrodes 22, emitter electrode 23, and isolation electrode 24, and being covered with a heat accumulation layer 901. Further thereon, interlayer film 902 composed of silicon oxide is formed by atmospheric pressure CVD, plasma CVD, sputtering, or a like method.

The end faces of electrodes 22,23,24 are slanted to improve remarkably the step-covering properties of interlayer film 902, so that interlayer film 902 can be made thinner than the conventional ones with the heat accumulation effect retained.

Holes are formed through interlayer 902 for electrical connection to collector/base common electrodes 22, emitter electrode 23, and isolation electrodes 24. Wiring electrode 904 is formed from Al or a like material to form electrical wiring on interlayer film 902. In other words, an electrothermal transducing element is provided by boring interlayer film 902 at local sites, forming heat-generating resistance layer 903 by sputtering of $HfB_2$ or the like, and forming wiring electrodes 904 by vapor-deposition or sputtering of Al or the like.

The material for constituting heat-generating resistance layer 903 includes Ta, $ZrB_2$, Ti—W, Ni—Cr, Ta—Al, Ta—Si, Ta—Mo, Ta—W, Ta—Cu, Ta—Ni, Ta—Ni—Al, Ta—Mo—Al, Ta—Mo—Ni, Ta—W—Ni, Ta—Si—Al, Ta—W—Al—Ni, and the like.

Wiring electrodes 904 formed from Al or the like have edge faces 904a, 904b as the connecting end faces which are slanted at an angle of 30° or more to the normal line.

Figure 9:
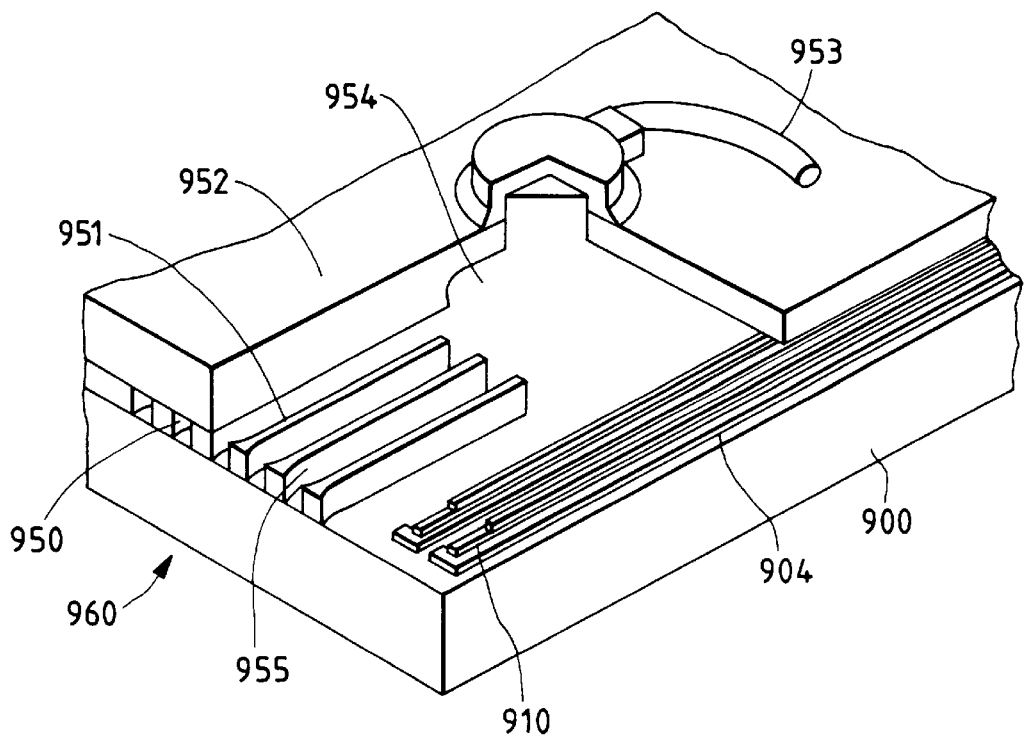
FIG. 9 is a schematic perspective view showing external appearance of the recording head produced in Example 3 with a portion broken away.
Figure 10A:
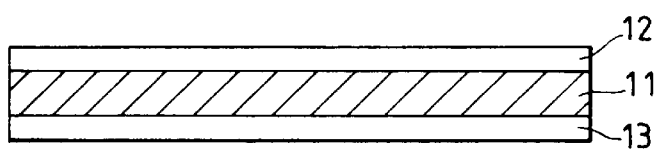
FIGS. 10A, 10B and 10C are schematic sectional views showing production steps in a prior art technique.
Figure 10B:
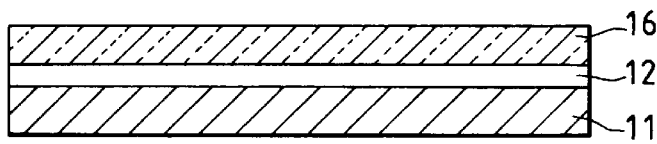
Figure 10C:
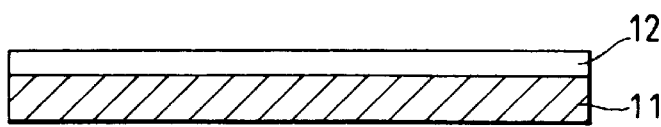

On electro-thermal transducing element 910, as shown in FIG. 8, protection film 905 composed of SiO, $SiO_2$, SiN, SiON, or the like and protection film 906 composed of Ta or the like are formed in integration with interlayer film 902 by sputtering or CVD. In FIGS. 8 and 9, numeral 950 denotes ejection opening; 951, liquid path wall member; and 952, cover plate.

Recording head 960 for an ink-jet recording system is prepared by attaching, to base member 900 having the above constitution, liquid path wall member 951 composed of a photosensitive resin or the like for forming liquid path 955 communicated to plural ejection opening 950, and cover plate 954 having ink-feed opening 953. The ink fed from ink feed opening 953 is stored once in common liquid chamber 954 inside the recording head, and is then fed to respective liquid paths 955. The ink is ejected by driving heat generation portion 910 of base member 900 through ejection opening 950.

The process for producing recording head 960 of the present invention is described below in more detail.

(1) On the surface of a P-type silicon substrate (impurity concentration: about $1\times10^{12}$ to $1\times10^{16}$ cm$^{-3}$), a silicon oxide film is formed in a thickness of about 8000 Å. The formed silicon oxide film at the prescribed regions for burying N-type collectors of the respective cells is removed by photolithography.

After formation of a silicon oxide film, N-type collector-burying regions of impurity concentration of $1\times10^{18}$ cm$^{-3}$ or higher are formed in a thickness of 2–6 µm by ion implantation of an N-type impurity (such as P and As) and thermal diffusion to obtain a low sheet resistance of 80 Ω/square or less.

Subsequently the silicon oxide film at the portions for burying P-type isolation regions is removed, and there silicon oxide film is formed in a thickness of about 1000 Å. P-type isolation burying regions of impurity concentration of from $1\times10^{15}$ to $1\times10^{17}$ cm$^{-3}$ or more are formed by ion implantation of P-type impurity (such as B) and thermal diffusion.

(2) The silicon oxide film on the entire face is removed, and N-type epitaxial region (impurity concentration: about $1\times10^{13}$ to $1\times10^{15}$ cm$^{-3}$) is grown epitaxially in a thickness of about 5–20 µm.

(3) On the surface of the N-type epitaxial region, a silicon oxide film is formed in a thickness of about 1000 Å. A resist is applied thereon, and patterned. Thereby, a P-type impurity is ion-implanted only to the portions for formation of low-concentration P-type base regions. After removing the resist, low-concentration P-type base regions (impurity concentration: about $1\times10^{14}$ to $1\times10^{17}$ cm$^{-3}$) is formed in a thickness of about 5 to 10 µm.

Alternatively, the P-type base region may be formed after the process of (1) by removing the oxide film, and growing a low-concentration epitaxial layer of a concentration of about $5\times10^{14}$ to $5\times10^{17}$ cm$^{-3}$ in a thickness of about 3 to 10 µm.

Subsequently the silicon oxide film is entirely removed again, and then another silicon oxide film is formed in a thickness of about 8000 Å. The silicon oxide film at the regions for formation of P-type isolation regions is removed. A BSG film is deposited over the entire face by CVD, and P-type isolation regions (impurity concentration: about $1\times10^{18}$ to $1\times10^{20}$ cm$^{-3}$) are formed by thermal diffusion in a thickness of about 10 µm so that the formed layer reaches the P-type isolation burying region. P-type isolation region 16 can be formed by use of $BBr_3$ as the diffusion source.

By use of the P-type epitaxial layer, as described above, a structure is possible which does not require the aforementioned P-type isolation burying region or P-type isolation region. In such a structure, the photolithography process and the impurity diffusion process for formation of the P-type isolation burying regions, the P-type isolation region, and the low-concentration base region can be omitted.

(4) The BSG film is removed, and then a silicon oxide film is formed in a thickness of about 8000 Å. The silicon oxide film at the portions for formation of N-type collector regions is removed. Then N-type collector region 17 (impurity concentration: about $1\times10^{18}$ to $1\times10^{20}$ cm$^{-3}$) is formed in a thickness of about 10 µm by N-type solid diffusion and phosphorus ion implantation of thermal diffusion to reach collector burying regions 17 and to have a sheet resistance of not higher than 10 Ω/square.

Subsequently, a thermal oxidation film is formed in a thickness of 3000 Å, and further thereon silicon nitride film 105 is deposited in a thickness of 400 nm by reaction of $SiH_4$ (silane) and $NH_3$ (ammonia) by low pressure CVD.

Then, polycrystalline silicon is deposited in a thickness of 700 Å by thermal decomposition of a nitrogen-diluted silane gas at 600–700° C. by low pressure CVD. The polycrystalline silicon is entirely converted to silicon dioxide by thermal oxidation in an oxygen-hydrogen atmosphere at 1000° C.

A photoresist is applied in a thickness of 1.0 µm on the surface, and is cured by heating. Then the silicon oxide film on the reverse face is removed by immersion into a buffered hydrofluoric acid solution as the first wet etching solution, which is the characteristic process of the present invention.

The photoresist on the front face is removed, and the silicon nitride film on the reverse face is removed by immersing the substrate in a heated phosphoric acid solution as the second wet etching solution.

Thereafter, the silicon dioxide film on the silicon nitride film on the front face is removed by a buffered hydrofluoric acid solution.

Then the silicone nitride film and the silicon oxide film in the cell regions are removed selectively.

Resist-patterning is conducted, and a P-type impurity is injected only into the portions where the high-concentration base regions 18 and the high-concentration isolation regions 19 are formed.

The resist is removed, and then the silicon oxide film is removed from the portions where N-type emitter regions and high-concentration N-type collector regions are to be formed. A thermal oxidation film is formed over the entire face. N-Type emitter regions and high-concentration N-type collector regions are simultaneously formed by injection of N-type impurity and thermal diffusion. The N-type emitter regions and the high-concentration N-type collector regions have respectively a thickness of not larger than 1.0 μm, and contain the impurity respectively at a concentration of about $1 \times 10^{18}$ to $1 \times 10^{20}$ $cm^{-3}$.

(5) Further, the silicon oxide film at the sites of electrode connection is removed. Then, Al or a like material is deposited over the entire face, and the Al was removed from the portions except the portions of the electrodes. This Al removal is conducted, not by conventional wet etching, by etching with the photoresist being moved continuously backward to obtain the wiring having slant edge face. The edge faces slanting at an angle of about 60° to the normal line can be satisfactorily obtained by use of an aqueous TMAH (tetramethylammonium hydroxide) solution, as the etchant, which is conventionally used as a developer for resist patterning.

(6) An $SiO_2$ film which is to become an interlayer film serving also as a heat accumulation layer is formed over the entire face in a thickness of about 0.6 to 2.0 μm by PCVD method. This interlayer film 102 may be formed by atmospheric pressure CVD, and may be an SiON film, an SiO film, or an SiN film in place of the $SiO_2$ film.

For the electric connection, through-holes TH are formed on the interlayer film corresponding to sites above the emitter regions and the base-collector regions by photolithography.

In the etching of the insulation film such as the interlayer film, and protection film, the end face of the etched film can be slanted (preferably at an angle of 30° to 75° to the normal line) by allowing the etching solution to penetrate into the interface between the resist (photoresist for masking) and the insulation film by use of a mixed acid etching solution such as $NH_4F+CH_3COOH+HF$. This improves the step-covering properties of the films formed on the interlayer film, and stabilizes the production process to improve the production yield.

(7) $HfB_2$ is deposited as heat-generating resistance layer 903 on the interlayer film, and for electric connection on electrodes corresponding to the electrode portions above the emitter regions and the base collector regions and above the electrodes through the through-holes TH in a thickness of about 1000 Å.

(8) On the heat-generating resistance layer, a layer of an Al material is deposited in a thickness of about 5000 Å to form pairs of wiring electrodes of electro-thermal transducer elements, diode cathode wiring electrodes, diode anode wiring electrodes. Then the Al and the $HfB_2$ (heat-generating resistance layer) are patterned to form simultaneously electro-thermal transducer elements and other wiring. The patterning of Al is conducted in the same manner as mentioned above.

(9) Thereon, an $SiO_2$ film is deposited serving as a protection layer for electro-thermal transducing elements and as an insulation layer for the Al wiring in a thickness of about 10000 Å by PCVD or a like method. In the film deposition, the film is grown at a relatively low temperature (150–250° C.) to prevent the growth of hirock in a similar manner as above. The protection layer may be formed from SiON, SiO, or SiN in place of the $SiO_2$.

On the heat generation portion, Ta is deposited in a thickness of about 2000 Å as protection layer 906 for cavitation resistance.

(10) The electro-thermal transducer element, the Ta film, and the $SiO_2$ film formed as described above are locally removed to form pads for bonding.

(11) Onto the base member having the semiconductor elements, a liquid path wall member, and a cover plate are attached to prepare a recording head having ink flow paths in the inside.

The process for forming hollow 980 is described below.

After formation of the electro-thermal transducer elements and driving functional elements on the Si substrate, the silicon oxide film grown (deposited) on the reverse face during formation of the above elements on the front face is patterned by photolithography to define hollow 980.

The surface of the front face of the silicon base member having the elements is protected by a resist and a jig, and the hollow 980 is formed on the reverse face by etching by use of 2% TMAH (tetramethylammonium hydroxide) solution heated to 90° C. as the etching solution. The mask formed on the reverse face may be an SiNx film deposited by low pressure gas phase synthesis.

The hollow 980 enables feeding of the ink either from the upside or from the downside of the heater. Therefore, in FIG. 9, the ink may be fed from the side of hollow 980, not from the upside of the heater.

The ink can be fed from the reverse side by formation of hollow 980 by the hollow formation process mentioned above, and providing the cover plate and the ink-ejection openings on the hollow side. In this case, the element side may be reinforced by bonding a reinforcing plate thereto. The reinforcing plate is preferably made of a material having a low thermal conductivity such as glass and quartz.

What is claimed is:

1. A process for producing an electronic device having a silicon nitride film on a substrate, comprising steps of forming a silicon nitride film and a silicon oxide film on a first face and a second face reverse to the first face of the substrate respectively, removing the silicon oxide film on the first face by wet etching, removing the silicon nitride film on the first face by wet etching, and removing the silicon oxide film on the second face by wet etching.

2. The process for producing the electronic device according to claim 1, wherein the silicon nitride film is formed by CVD.

3. The process for producing the electronic device according to claim 2, wherein the CVD is conducted by a low pressure CVD method.

4. The process for producing the electronic device according to claim 1, wherein the silicon oxide film is obtained by oxidation of a silicon film formed by CVD.

5. The process for producing the electronic device according to claim 4, wherein the CVD is conducted by a low pressure CVD method.

6. The process for producing the electronic device according to claim 4, wherein the oxidation is conducted by thermal oxidation.

7. The process for producing the electronic device according to claim 1, wherein the silicon oxide film is removed by an etching solution containing hydrogen fluoride.

8. The process for producing the electronic device according to claim 1, wherein the silicon nitride film is removed by an etching solution containing phosphoric acid.

9. The process for producing the electronic device according to claim 4, wherein the silicon film is comprised of polycrystalline silicon.

10. The process for producing the electronic device according to claim 4, wherein the silicon film is comprised of amorphous silicon.

11. The process for producing the electronic device according to claim 1, wherein the silicon oxide film on the first face is removed while a resist is provided on the silicon oxide film on the second face.

12. The process for producing the electronic device according to any of claims 1 to 11, wherein the electronic device constitutes a liquid crystal display apparatus.

13. The process for producing the electronic device according to any of claims 1 to 11, wherein the electronic device constitutes an ink-jet recording head.

* * * * *

UNITED STATES PATENT AND TRADEMARK OFFICE
CERTIFICATE OF CORRECTION

PATENT NO.    : 6,022,751
DATED         : February 8, 2000
INVENTOR(S)   : Hitoshi Shindo et al.

It is certified that error appears in the above-identified patent and that said Letters Patent is hereby corrected as shown below:

Title page,
Item [56], References Cited, U.S. PATENT DOCUMENTS,
Insert: -- 4,219,379    8/1980  Athanas
         5,131,978    7/1992  O'Neill --;

FOREIGN PATENT DOCUMENTS,
"01 022051" should read -- 1-022051 --; and
Insert: -- 2-109337    4/1990    Japan
         5-090490    4/1993    Japan
         0 689 086   12/1995   European Pat. Off.
         0 659 564    6/1995   European Pat. Off. --; and OTHER PUBLICATIONS,
Insert: -- Solid State Technology, May 1981, pages 65-72 --.

Column 1,
Line 53, "causing" should read -- causing a --; and
Line 67, "matters" should read -- matter --.

Column 2,
Line 17, "matters" should read -- matter --;
Line 32, "matters" should read -- matter --;
Line 46, "of" should read -- of a --; and
Line 57, "showing" should read -- showing an --.

Column 3,
Line 49, "periphery" should read -- the periphery --.

Column 4,
Line 23, "of" should read -- of a --; and
Line 34, "intercept" should read -- intercepts --.

Column 7,
Line 10, "scratch" should read -- scratches --;
Line 24, "p-Well" should read -- P-Well --; and
Line 63, "scratch" should read -- scratches --.

UNITED STATES PATENT AND TRADEMARK OFFICE
CERTIFICATE OF CORRECTION

PATENT NO. : 6,022,751
DATED : February 8, 2000
INVENTOR(S) : Hitoshi Shindo et al.

It is certified that error appears in the above-identified patent and that said Letters Patent is hereby corrected as shown below:

<u>Column 8,</u>
Line 18, "a" (first occurrence) should read -- an --; and "a" (second occurrence) should be deleted.

Signed and Sealed this

Nineteenth Day of March, 2002

Attest:

JAMES E. ROGAN
*Director of the United States Patent and Trademark Office*

*Attesting Officer*